United States Patent [19]

Hogeboom et al.

[11] Patent Number: 4,679,209
[45] Date of Patent: Jul. 7, 1987

[54] DIGITAL LINE RECEIVER

[75] Inventors: John G. Hogeboom; Terence N. Thomas, both of Nepean, Canada

[73] Assignee: Northern Telecom Limited, Montreal, Canada

[21] Appl. No.: 756,680

[22] Filed: Jul. 19, 1985

[30] Foreign Application Priority Data

Feb. 13, 1985 [CA] Canada ............................. 474246

[51] Int. Cl.$^4$ .................. H04L 25/34; H03K 3/53
[52] U.S. Cl. ................................. 375/17; 375/76; 329/179; 307/358
[58] Field of Search .............. 375/17, 76; 178/69 D; 329/136, 178–179; 307/358–359

[56] References Cited

U.S. PATENT DOCUMENTS 4,380,080  4/1983  Rattlingourd .................... 375/17
4,479,266  10/1984  Eumurian et al. .............. 307/358

Primary Examiner—Robert L. Griffin
Assistant Examiner—Andrew J. Telesz, Jr.
Attorney, Agent, or Firm—Michael M. Sakovich

[57] ABSTRACT

A stream of high-speed bipolar signals transmitted along standard twisted pair telephone wiring are detected by a circuit that includes a pair of differential amplifiers each having a signal input connected directly to one conductor of the twisted pair and a reference input connected through a peak voltage detector to the opposite conductor. The amplifiers function as an input signal comparator which generates a corresponding bit stream of logical ones in response to the bipolar signals that exceed 50% of the average peak voltage input. A threshold bias voltage corresponding to positive going signals on each conductor is generated by the detector and charges separate capacitors that connect each reference input to its conductor. The bias voltage and bipolar signals input to each amplifier are algebraically summed which doubles the differential input signal and results in an increased signal to noise ratio of about six decibels.

11 Claims, 2 Drawing Figures

4,679,209

DIGITAL LINE RECEIVER

FIELD OF THE INVENTION

This invention relates to a digital signal receiver and more particularly to a digital line receiver for detecting a stream of bipolar input signals and generating a corresponding bit stream of logical ones in response thereto.

BACKGROUND OF THE INVENTION user demand has demonstrated a need for increasingly higher speed digital access in new office communication controllers as daily routines become more complex and greater demands are placed on improving productivity. Current Local Area Network (LAN) solutions that provide this higher speed are beset by high cost and congestion. Moreover, these solutions are usually poorly suited to integrating voice services.

An alternative to the tradiational LAN approach is to integrate all voice and data services into a centralized controller and to utilize inexpensive standard in-building twisted pair wiring to provide the required interconnects. A commonly experienced problem in this approach is the restriction to low baud rates for transmission. Notwithstanding the limited transmission capability of standard twisted pair wiring, a viable centralized controller is expected to execute both ends of a 2.56 Mb/s digital line interface over such wiring.

SUMMARY OF THE INVENTION

Accordingly, a principal object of the present invention is to provide a digital line receiver that is operable as an interface over standard twisted pair wiring at transmission rates up to at least 2.56 Mb/s.

Another provision of the invention is a digital line receiver having differential input amplifiers that provide common-mode noise rejection while maximimizing eye opening to a data detector.

Still another provision of the invention is a digital line receiver that provides some immunity to high-frequency noise pulses that could otherwise disturb threshhold operating levels of the differential amplifiers.

Yet another provision of the invention is a digital line receiver that responds principally to a predetermined differential to achieve maximum signal dynamic range and a minimum mismatch between positive and negative peaks of a bipolar input signal.

The problems associated with the prior art may be substantially overcome and the foregoing objectives achieved be recourse to the present invention which relates to a digital line receiver that comprises, comparator means having a pair of differential inputs including a pair of signal terminals connectable to a source of bipolar signals, and a pair of corresponding reference terminals each cross-coupled to an opposite one of the signal terminals, and an output producing a train of pulses in response to the bipolar signals having a first predetermined voltage, peak detector means having a pair of input terminals each coupled to a corresponding one of the signal terminals and adapted to receive a the bipolar signals at a second predetermined voltage, and a pair of corresponding outputs each producing a threshold voltage in response thereto and coupling the threshold voltage to the corresponding reference terminal of the comparator means, and capacitor means connected between each reference terminal and its opposite signal terminal for coupling therebetween the bipolar signals at a third predetermined voltage in serial relation with the threshold voltage and receiving a charge corresponding to the threshhold voltage, whereby bipolar signals input to the signal terminals are algebraically summed in the comparator mans with the corresponding threshold voltages and the bipolar signals of the third predetermined voltage.

BRIEF DESCRIPTION OF THE DRAWINGS

The invention will now be more particularly described with reference to an embodiment thereof shown, by way of example, in the accompanying drawings in which.

DESCRIPTION OF THE PREFERRED EMBODIMENT

Figure 1:
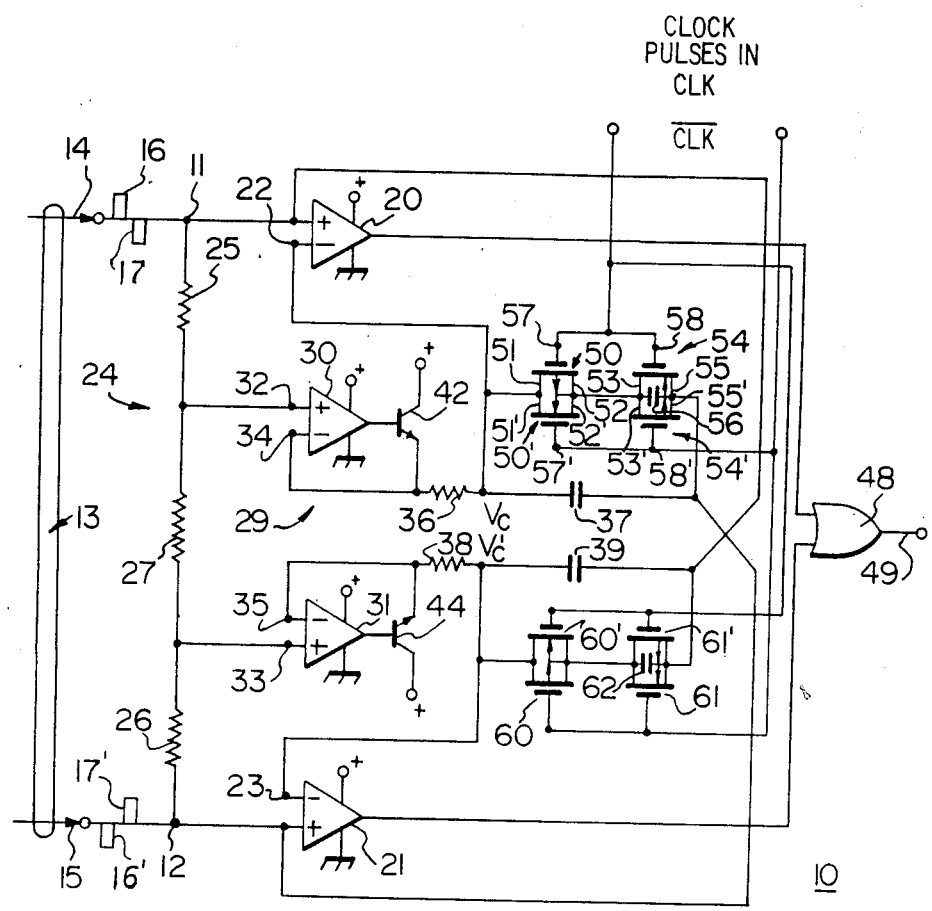
FIG. 1 is a schematic diagram of a digital line receiver in accordance with the present invention.
Figure 2:
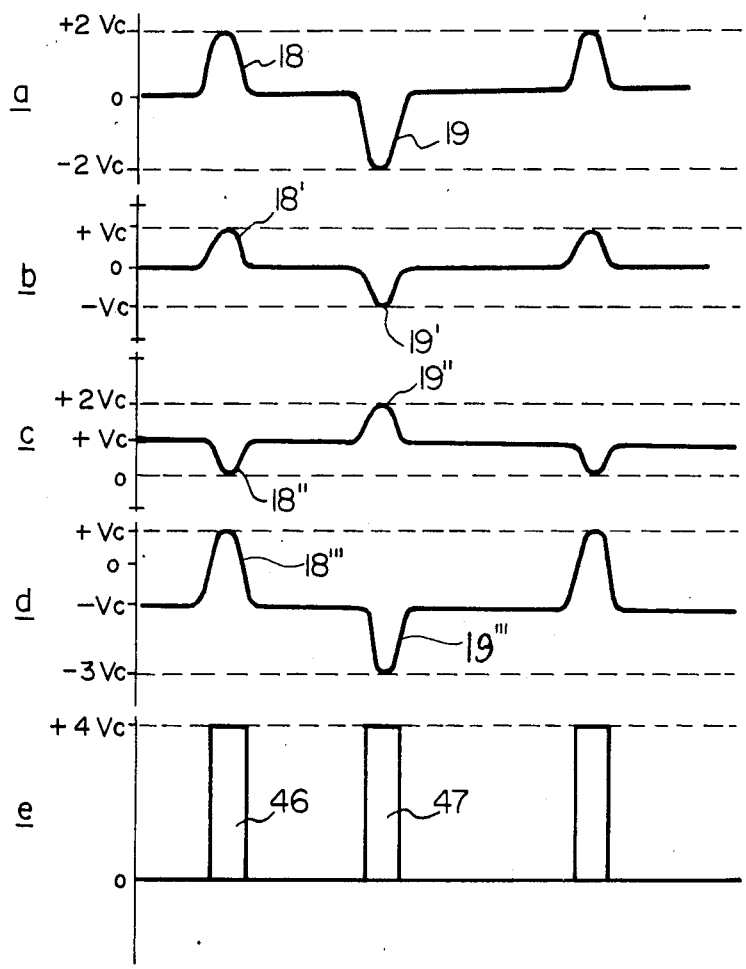
FIG. 2a illustrates typical bipolar signals appearing across a pair of input signal terminals in the receiver of FIG. 1.
FIG. 2b illustrates the respective signals of FIG. 2a measured relative signal ground.
FIG. 2c illustrates typical waveforms measured relative signal ground and appearing at a pair of reference terminals of the receiver of FIG. 1.
FIG. 2d illustrates typical waveforms representing a differential input between corresponding signal and reference terminals of the receiver of FIG. 1.
FIG. 2e illustrates typical waveforms of signals input to an output gate in the receiver of FIG. 1.

A schematic diagram of a digital line receiver 10 is shown in FIG. 1 with a pair of input signal terminals 11 and 12 which are connected to a telephone line shown as a standard twisted pair 13 comprising individual conductors 14 and 15. The pair 13 are employed in the transmission of a signal stream composed of alternate mark inverted encoded pulses 16 and 17 which appear at the terminal 11 relative the terminal 12 of FIG. 1 in an idealized form. Note that corresponding pulses 16' and 17' of opposite polarity appear at the terminal 12 relative the terminal 11. Typical signals applied across the terminals 11 and 12, following modification by the capacitive, resistive and inductive effects of the pair 13, appear as bipolar signals 18 and 19 as shown in FIG. 2a.

The receiver 10 functions to detect logical ones whenever the terminals 11 and 12 differ in voltage by more then 50% of the average peak voltage applied thereto. Having regard to FIG. 2b the signals 18' and 19' typify the input to the terminal 11 relative signal ground as a reference node. As regards the terminal 12 relative signal ground, it will be understood that the signals 18' and 19' would be of equal magnitude but of opposite polarity.

It will be observed that the terminals 11 and 12 are connected to a pair of positive inputs of a comparator circuit that comprises two differential amplifiers 20 and 21. The amplifiers 20 and 21 also include a pair of reference terminals 22 and 23 which are connected to negative inputs as shown. Although not indicated in FIG. 1, it will be understood that the amplifiers 20 and 21 have considerably lower sensitivity to a common-mode voltage applied to the terminals 11 and 12 than to a differential voltage applied thereto. Common-mode voltage refers to voltages having the same polarity whereas differential voltages are of opposite polarity. In the receiver 10, it is intended that the signals 18 and 19 be mainly differential to achieve a maximum signal dynamic range and a minimum mismatch between positive and negative going peaks.

A voltage divider 24, consisting of like valued resistors 25 and 26 and a lower valued resistor 27, is connected across the terminals 11 and 12. In this arrangement the complete incoming bipolar signal is applied to the positive inputs of the amplifiers 20 and 21 whereas the input signals appearing at the junctions of the resistors 25, 26 and 27 are of reduced magnitude. Thus, at the junction of the resistors 25 and 27 the signal voltage is slightly greater than 50% of the peak voltage at the terminal 11 relative to the terminal 12. Similarly the signal voltage at the junction of the resistors 26 and 27 is slightly greater than 50% of the peak voltage at the terminal 12 relative the terminal 11.

The reduced signal voltages of the divider 24 are input to a peak detector 29 which comprises a pair of differential amplifiers 30 and 31. Each amplifier 30 and 31 includes a pair of input terminals 32 and 33 which are connected to the junctions of the resistors 25 and 27 and 26 and 27, respectively. A second pair of input terminals 34 and 35 serve as reference inputs for their respective amplifiers and are cross-coupled to an opposite input terminal. Thus, the terminal 34 is shown coupled to the terminal 12 via a resistor 36 in series with a bias capacitor 37. Similarly, the terminal 35 is cross-coupled to the terminal 11 via a resistor 38 in series with a bias capacitor 39. Thus, except for stray capacitances between circuit conductors and power rails, together with the common-mode range of the amplifiers 20 and 21, the terminal 11 may be considered as a reference node for the operation of the amplifier 31 in the peak detector whereas the terminal 12 may be considered as the reference node for the amplifier 30 of the peak detector.

The purpose of the resistor 27 is to compensate for the aforenoted loss mechanisms in the peak detector 29 and for the absence of a very high common-mode rejection in the amplifiers 30 and 31. Accordingly, a positive going signal, corresponding to the signal 18' of FIG. 2b, is applied to the terminal 32 from the voltage divider 24 and produces an output at the amplifier 30 which is applied to the base of an NPN transistor 42, turning the transistor on and charging the capacitor 37 through the resistor 36 to a bias voltage +Vc. The voltage +Vc is the peak voltage at the terminal 32 relative to the terminal 12 less voltage drops in the amplifier 30, the transistor 42 and the resistor 36. Vc should be 50% of the peak voltage at the terminal 11 relative to the terminal 12. The voltage is less, however, due to the aforenoted voltage drops as well as to stray circuit capacitance along with the emitter-base junction capacitance of the transistor 42. These losses are corrected by adjusting the value of the resistor 27 to give an appropriately increased voltage at the terminal 32 relative the terminal 12.

It will be understood from the foregoing description that the amplifier 30 and the transistor 42 function together as a diode equivalent having a low offset voltage. Together, the resistor 36 and the capacitor 37 act as a low-pass filter to reduce sensitivity to short noise spikes such as may be produced by logic circuitry. The capacitor 37 also operates to store the detected peak voltage which is applied to the amplifier 20 via the terminal 22 as the threshold bias voltage +Vc.

Referring next to FIG. 2d, the effect of the bias voltage +Vc on the signal 18 (FIG. 2a) will be seen having regard to FIGS. 2b and 2c. Thus, as the signal at the terminal 11 rises from zero to an effective maximum amplitude of +Vc relative signal ground as shown at 18', an equal and opposite peak at the terminal 22 simultaneously varies from the bias voltage +Vc value to zero as indicated at 18''. This occurs because of a simultaneous inverse signal swing at the terminal 12 relative signal ground. The signal 18'' is developed at the terminal 12 relative signal ground and is coupled via the capacitor 37 to the terminal 22 in opposed serial relation with the bais voltage +Vc.

During the interval of the signal 19 (FIG. 2a), the signal at the terminal 11 swings from zero to an effective minimum amplitude of −Vc relative signal ground as shown at 19'. Simultaneously a signal 19'' is developed at the terminal 12 relative signal ground and is coupled to the terminal 22 via the capacitor 37 in serially aiding relation with the bias voltage +Vc. The resultant signal at the terminal 22 therefore varies from +Vc to +2 Vc as indicated at 19''. The overall result is a differential input at the terminals 11 and 22 which varies from +Vc to −3 Vc as shown by the waveforms 18''' and 19''' in FIG. 2d.

The operation of the other half of the peak detector 29 is the same as that described for the first half except that the ground reference point is taken to be the terminal 11. Accordingly, the amplifier 31 together with an NPN transistor 44 function as a diode equivalent to charge the capacitor 39 to the bias voltage +Vc'. Applied to the terminal 23 as a threshold bias, the voltage +Vc' operates in the same manner as the voltage +Vc at the terminal 22 since the circuit of the receiver 10 is symmetrical.

The effect of using the opposite input terminal 12 or 11 as a reference node for the inverting input terminal 22 and 23, respectively, of each amplifier 20 and 21 is to increase the input signal to noise ratio by nearly 6 decibels while maintaining noise and interference signals unchanged as compared to the conventional method of using an electrical mid-point between the terminals 11 and 12 as a signal ground reference.

Waveforms 46 and 47 constitute the signal outputs of the amplifiers 20 and 21, respectively, which are input to an OR gate 48 that, in turn, produces a corresponding bit stream of logical ones at its output 49. The waveform 46 is the signal output corresponding to the signal 18''' which is the positive going part of the differential input to the amplifier 20. As regards the signal 19''' which is the negative going part of the differential input to the amplifier 20, this signal does not result in the signal output waveform 47. It will be understood from the preceding description that during the time interval of the signal 19''', a corresponding positive going part of a differential input to the amplifier 21 results in the waveform 47. The bit stream of logical ones therefore derives from a series of alternate waveforms 46 and 47 input to the OR gate 48.

In order that the bias voltages +Vc and +Vc' may follow the fluctuations in the peaks of the bipolar input signals, it is required to bleed the capacitors 37 and 39 at a predetermined rate. This is achieved by recourse to a known solid-state switch which functions to alternately charge and discharge a small-valued dumping capacitor. In the case of the capacitor 37, a P channel Field Effect Transistor (FET) 50 is connected in parallel with a complementary N channel FET 50' such that the drains 51 and 51' thereof are connected to the terminal 22 and their respective sources 52 and 52' are connected to drains 53 and 53' of a complementary pair of N channel and P channel FETs 54 and 54'. These latter FETs are likewise connected in parallel so that their sources 55 and 55' are connected to the terminal 12. A dumping capacitor 56 is connected between the sources and drains of the FETs 54 and 54'.

Trigger signals shown as clock pulses CLK and $\overline{CLK}$ are applied to gates 57, 57' and 58, 58', alternately, to time the operation of the foregoing FET switch. Appropriate CLK and $\overline{CLK}$ pulses turn on the FETs 50 and 50' which permits the capacitor 37 to discharge therethrough to charge the capacitor 56. The FETs 50 and 50' are subsequently switched off by reversing the polarity of the clock pulses and the FETs 54 and 54' are switched on by application of the CLK and $\overline{CLK}$ pulses to their gates 58 and 58'. The capacitor 56 is therefore discharged during the time that the FETs 54 and 54' are switched on.

Periodic partial discharge of the capacitor 39 occurs in the same manner as described for the capacitor 37 using corresponding P and N channel FETs 60 and 60' and corresponding N and P channel FETs 61 and 61' configured as a solid-state switch together with a dumping capacitor 62.

It will be apparent to those skilled in the art to whom this specification is addressed that the embodiment heretofore described may be varied to meet specialized requirements without departing from the true spirit and scope of the invention disclosed. Accordingly, the described embodiment should not be taken as indicative of the limits of the invention but rather as an exemplary structure thereof which is described by the claims appended hereto.

The embodiments of the invention in which an exclusive property or privilege is claimed are defined as follows:

1. A digital line receiver, comprising:
   comparator means having a pair of differential inputs including a pair of signal terminals connectable to a source of bipolar signals, and a pair of corresponding reference terminals each cross-coupled to an opposite one of the signal terminals, and an output producing a train of pulses in response to the bipolar signals having a first predetermined voltage;
   peak detector means having a pair of input terminals each coupled to a corresponding one of the signal terminals and adapted to receive the bipolar signals at a second predetermined voltage, and a pair of corresponding outputs each producing a threshold voltage in response thereto and coupling the threshold voltage to the corresponding reference terminal of the comparator means; and
   capacitor means connected between each reference terminal and its opposite signal terminal for coupling therebetween the bipolar signals at a third predetermined voltage in serial relation with the threshold voltage and receiving a charge corresponding to the threshold voltage, whereby bipolar signals input to the signal terminals are algebraically summed in the comparator means with the corresponding threshold voltages and the bipolar signals of the third predetermined voltage.

2. A receiver as claimed in claim 1 further comprising means for periodically discharging a portion of the charge required by the capacitor means to permit following fluctuations in bipolar signal peaks.

3. A receiver as claimed in claim 2 wherein the capacitor means comprises a pair of separate bias capacitors.

4. A receiver as claimed in claim 3 wherein the means for discharging a portion of the charge acquired by the capacitor means comprises:
   a pair of dumping capacitors each having a free terminal and one terminal joining a terminal of a corresponding bias capacitor; and
   switch means serially connected with the free terminal of each dumping capacitor and the other terminal of the bias capacitor and operably responsive to a source of trigger signals to enable momentary connection of each dumping capacitor across its corresponding bias capacitor to discharge a portion of the charge thereon.

5. A receiver as claimed in claim 4 wherein the switch means further comprises means for alternately shorting each dumping capacitor when disconnected from its corresponding bias capacitor.

6. A receiver as claimed in claim 5 wherein the switch means comprises a first pair of parallel connected complementary N and P channel Field Effect Transistors serially connected with a second pair of parallel connected complementary N and P channel Field Effect Transistors with the first and second pairs of transistors bridging the bias capacitor and one of the pairs of transistors bridging the dumping capacitor.

7. A receiver as claimed in claim 6 wherein the input terminals of the peak detector are coupled to the signal terminals via a resistive bridge comprising first and second resistors of the same value, each resistor having a free end and one end connected to a respective one of the input terminals, and a third resistor of lesser value connected between the free ends of the first and second resistors and across the input terminals of the peak detector.

8. A receiver as claimed in claim 7 wherein the comparator means comprises a pair of first differential amplifiers each having a differential input of which a first pair of corresponding inputs comprise the pair of signal terminals and a second pair of corresponding inputs comprise the pair of reference terminals.

9. A receiver as claimed in claim 8 wherein the peak detector means comprises a pair of second differential amplifiers each having a differential input of which a first pair of corresponding inputs comprise the pair of input terminals coupled to the signal terminals via the resistive bridge and a second pair of corresponding inputs are each coupled to a corresponding one of the peak detector outputs.

10. A receiver as claimed in claim 9 wherein the outputs of the peak detector means each comprise a transistor having a base electrode connected to an output terminal of one of the second differential amplifiers, a collector electrode connected to a source of operating voltage and an emitter electrode connected to the reference terminal of the corresponding first differential amplifier via a current limiting resistor.

11. A receiver as claimed in claim 10 wherein the output of the comparator means comprises separate outputs from the first differential amplifiers connected as inputs to an OR gate having an output producing a bit stream of logical ones.

* * * * *